United States Patent
Lee et al.

(10) Patent No.: US 7,943,926 B2
(45) Date of Patent: May 17, 2011

(54) NONVOLATILE MEMORY DEVICE AND NONVOLATILE MEMORY ARRAY INCLUDING THE SAME

(75) Inventors: Myoung-Jae Lee, Suwon-si (KR);
In-Kyeong Yoo, Suwon-si (KR);
Eun-Hong Lee, Anyang-si (KR);
Jong-Wan Kim, Seongnam-si (KR);
Dong-Chul Kim, Suwon-si (KR);
Seung-Eon Ahn, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 279 days.

(21) Appl. No.: 11/711,616

(22) Filed: Feb. 28, 2007

(65) Prior Publication Data
US 2007/0205456 A1    Sep. 6, 2007

(30) Foreign Application Priority Data
Mar. 2, 2006    (KR) .................. 10-2006-0019915

(51) Int. Cl.
*H01L 29/10*    (2006.01)
*H01L 29/12*    (2006.01)
(52) U.S. Cl. .......... 257/43; 438/104; 365/148; 365/175; 365/186
(58) Field of Classification Search .................. None
See application file for complete search history.

(56) References Cited

U.S. PATENT DOCUMENTS

| | | | |
|---|---|---|---|
| 3,958,262 A * | 5/1976 | Merrin | 430/84 |
| 2005/0247921 A1* | 11/2005 | Lee et al. | 257/2 |
| 2006/0097288 A1* | 5/2006 | Baek et al. | 257/208 |
| 2006/0098472 A1* | 5/2006 | Ahn et al. | 365/145 |
| 2006/0131554 A1* | 6/2006 | Joung et al. | 257/2 |
| 2006/0250836 A1* | 11/2006 | Herner et al. | 365/148 |
| 2006/0250837 A1* | 11/2006 | Herner et al. | 365/148 |
| 2007/0114508 A1* | 5/2007 | Herner et al. | 257/2 |
| 2007/0120124 A1* | 5/2007 | Chen et al. | 257/43 |
| 2007/0228354 A1* | 10/2007 | Scheuerlein | 257/3 |
| 2007/0228414 A1* | 10/2007 | Kumar et al. | 257/183 |
| 2007/0236981 A1* | 10/2007 | Herner | 365/148 |

FOREIGN PATENT DOCUMENTS

| | | |
|---|---|---|
| CN | 1691334 | 11/2005 |
| WO | WO 2006/007525 A1 | 1/2006 |

OTHER PUBLICATIONS

Nel et al., Fabrication and characterisation of NiO/ZnO structures. Apr. 21, 2004. Elsevier, Sensors and Actuators B 100, pp. 270-276.*

(Continued)

*Primary Examiner* — Andy Huynh
*Assistant Examiner* — Hoang-Quan T Ho
(74) *Attorney, Agent, or Firm* — Harness, Dickey & Pierce, PLC (57) ABSTRACT

A nonvolatile memory device having self-presence diode characteristics, and/or a nonvolatile memory array including the nonvolatile memory device may be provided. The nonvolatile memory device may include a lower electrode, a first semiconductor oxide layer on the lower electrode, a second semiconductor oxide layer on the first semiconductor oxide layer, and/or an upper electrode on the second semiconductor oxide layer.

9 Claims, 7 Drawing Sheets

OTHER PUBLICATIONS

Ohya et al. Oxide Thin Film Diode Fabricated by Liquid-Phase Method. Sep. 1996. Japan Journal of Applied Physics. vol. 35, pp. 4738-4742.*

Kim et al. Improvement of resistive memory switching in NiO using Ir02. 2006. Applied Physics Letters. vol. 88. p. 232106.*

Seo et al. Reproducible resistance switching in polycrystalline NiO films. Dec. 6, 2004. Applied Physics Letters. vol. 85, No. 23. pp. 5655-5657.*

Choi et al. Resistive switching mechanism of TiO2 thin films grown by atomic-layer deposition. 2005. Journal of Applied Physics. vol. 98, pp. 033715.*

Japanese Office Action dated Sep. 8, 2009, with English translation.

Chinese Office Action, dated Jul. 21, 2009, with English Translation thereof.

Chinese Office Action dated Mar. 26, 2010 with English translation for corresponding Chinese Application No. 200610132100.5.

* cited by examiner

NONVOLATILE MEMORY DEVICE AND NONVOLATILE MEMORY ARRAY INCLUDING THE SAME

PRIORITY STATEMENT

This application claims the benefit of priority of Korean Patent Application No. 10-2006-0019915, filed on Mar. 2, 2006 in the Korean Intellectual Property Office, the entire contents of which are incorporated herein in its entirety by reference.

BACKGROUND

1. Field

Example embodiments relate to a nonvolatile memory device, and for example, to a higher-density nonvolatile memory device with self-presence diode characteristics, which may be simpler to manufacture without a transistor and/or a diode, and/or a nonvolatile memory array including the higher-density nonvolatile memory device.

2. Description of Related Art

Semiconductor memory devices may be manufactured to have a higher degree of integration by forming a larger number of memory cells in each unit area, operate at higher speeds, and/or be driven at lower power levels. Accordingly, a vast amount of research has been conducted in order to develop semiconductor memory devices. Accordingly, various types of memory devices have been introduced.

A semiconductor memory device may include many memory cells connected in a circuit. For example, in Dynamic Random Access Memory (DRAM), which may be an example of a semiconductor memory device, a unit memory cell may be composed of a switch and/or a capacitor. A DRAM may be advantageous because a DRAM may have a higher degree of integration and/or may operate at higher speeds. However, when the supply of power to the DRAM is discontinued, all data stored in DRAM may be lost. A flash memory device may be an example of a nonvolatile memory device in which stored data may be maintained if the power supply is discontinued. However, although flash memory devices may have nonvolatile characteristics, for example unlike a volatile memory device, the degree of integration and/or operating speed of flash memory devices may be less than those of DRAM.

Research has been conducted on nonvolatile memory devices, for example research has been conducted on Magnetic Random Access Memory (MRAM), Ferroelectric Random Access Memory (FRAM), Phase-change Random Access Memory (PRAM), and/or Resistance Random Access Memory (RRAM).

In MRAM, data may be stored by changing a magnetization direction in a tunnel junction. In FRAM, data may be stored using the polarization characteristics of ferroelectrics. Both MRAM and FRAM may have advantages and disadvantages, but as described above, there may be a need for a semiconductor memory device that has a higher degree of integration, operates at higher speeds and/or lower power levels, and/or has better data storage characteristics. PRAM may include a resistor and/or a switch (for example a transistor), and may store data using a change in a resistance value caused by a phase change in a specific material. The PRAM may use a chalcogenide resistor that may be changed into a crystalline phase or an amorphous phase by controlling the temperature at which the resistor may be formed. For example, the PRAM may be a memory device manufactured based on the fact that the resistance value in an amorphous phase may be higher than the resistance value in a crystalline phase.

Figure 1A:
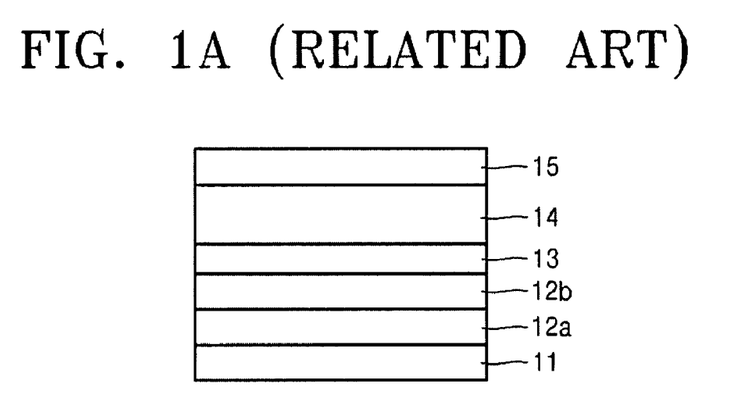
FIG. 1A is a cross-sectional view of a related resistance memory device.

RRAM may use the characteristics (for example, resistance conversion characteristics) that a resistance value may vary according to a bias voltage of a transition metal oxide. FIG. 1A is a diagram of a related RRAM device that may use a resistance conversion material having a general structure.

Referring to FIG. 1A, an n-type semiconductor layer 12a, a p-type semiconductor 12b, an intermediate electrode 13, an oxide layer 14, and/or an upper electrode 15 may be formed on a lower electrode 11. For example an n-type semiconductor layer 12a, a p-type semiconductor 12b, an intermediate electrode 13, an oxide layer 14, and/or an upper electrode 15 may be sequentially formed on a lower electrode 11. The lower electrode 11, the intermediate electrode 13, and the upper electrode 15 may be formed of a general conductive material. The oxide layer 14 may act as a memory node and may be formed of a transition metal oxide with resistance conversion (for example, variable resistance) properties. For example, the oxide layer 14 may be formed of $ZnO$, $TiO_2$, $Nb_2O_5$, $ZrO_2$, or Ni oxide.

Although the oxide layer 14 may have an electrode at both ends of the oxide layer to be able to operate as a memory node, an additional switching structure may be needed to drive a memory device with an array structure. Accordingly, a general memory device may be constructed to be connected to a transistor structure or a diode structure. A manufacturing process of the transistor structure may be complicated when compared to the diode structure, and the manufacturing of a higher-density memory array with the transistor structure may be limited. The diode structure may mainly be employed in a cross-point type structure which may be a simple memory array structure. The n-type semiconductor layer 12a and the p-type semiconductor layer 12b of FIG. 1A may be diode structures.

Figure 1B:
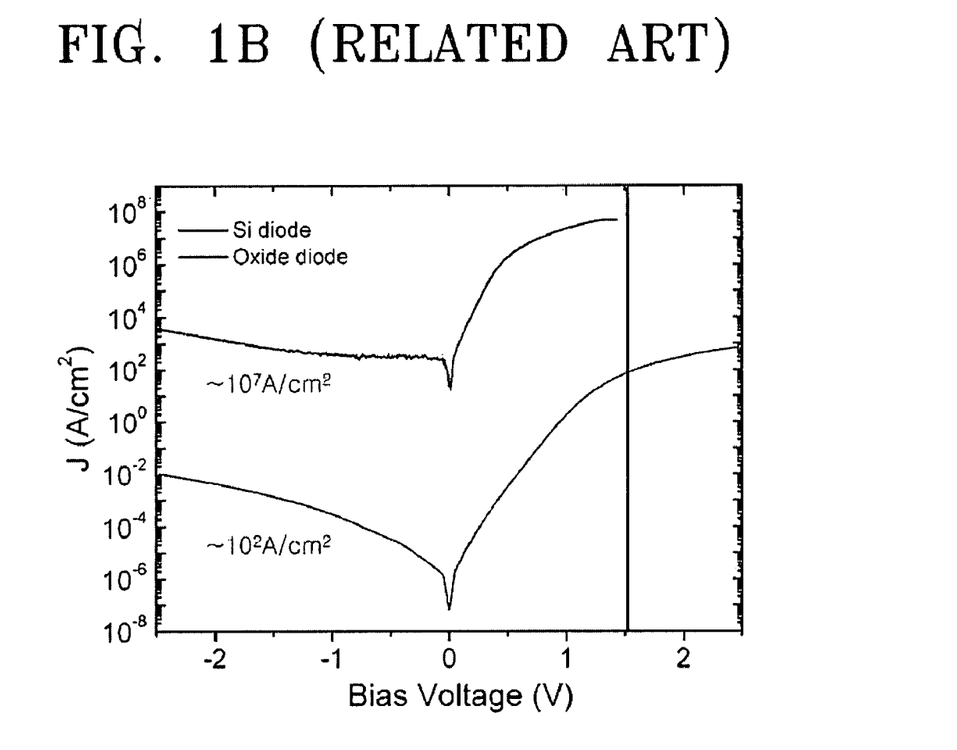
FIG. 1B is an example graph illustrating the electrical density versus bias voltage electrical characteristics of a related silicon diode and a related oxide diode.

A silicon diode and/or an oxide diode may be used as the n-type semiconductor layer 12a and the p-type semiconductor layer 12b, respectively. FIG. 1B is an example graph illustrating the electrical density versus bias voltage electrical characteristics of a related silicon diode and a related oxide diode. Referring to FIG. 1B, the silicon oxide may have a comparatively higher electric density to $10^7$ A/cm$^2$, and the oxide diode may have a comparatively lower electric density to $10^3$/cm$^2$. In terms of a related manufacturing process, the diode structure needs to be formed on the lower electrode 11, and for example, on a metal layer, in the RRAM device illustrated in FIG. 1A. However, the silicon diode may be difficult to deposit on a metal layer even though the silicon diode may be deposited on a metal layer at about 1000° C. through laser annealing, and it may be difficult to put the silicon diode to practical use. The oxide diode may be formed on the metal layer but may have comparatively lower electric density than the silicon diode.

A deposition process and/or an etching process needs to be repeatedly performed to form the diode structure in a cross-point type memory device array. For example, in a structure with multiple stacks as shown in FIG. 1A, it may be difficult to manufacture an array-structured memory device that may operate stably while guaranteeing a yield.

SUMMARY

Example embodiments may provide a nonvolatile memory device having self-presence diode characteristics, in which a diode structure may be formed into a simpler structured resistance memory, and a nonvolatile memory array may include the nonvolatile memory device.

According to an example embodiment, a nonvolatile memory device may include a lower electrode, a first semiconductor oxide layer on the lower electrode, a second semiconductor oxide layer on the first semiconductor oxide layer, and/or an upper electrode formed on the second semiconductor oxide layer.

According to an example embodiment, the first semiconductor oxide layer may be one of a p-type semiconductor and n-type semiconductor and/or the second semiconductor oxide layer may be one of a p-type semiconductor and a n-type semiconductor.

According to an example embodiment, the n-type semiconductor may include one selected from a group comprising $TiO_2$, $HfO$, $ZrO$, $ZnO$, $WO_3$, $CoO$, and $Nb_2O_5$.

According to an example embodiment, the p-type semiconductor may include Ni oxide.

According to an example embodiment, the first semiconductor oxide layer and/or the second semiconductor oxide layer may be p-n diode coupled.

According to an example embodiment, the lower electrode and the first semiconductor oxide layer, or the upper electrode and the second semiconductor oxide layer may be schottky diode coupled.

According to an example embodiment, the first semiconductor oxide layer or the second semiconductor oxide layer may include a transition metal oxide.

According to an example embodiment, a nonvolatile memory array may include a first electrode in a first direction, a second electrode intersecting the first electrode in a second direction, and/or a first type semiconductor oxide layer and/or a second type semiconductor oxide layer which may be between the first and second electrodes.

According to an example embodiment, the nonvolatile memory device may further include a plurality of the lower electrode in a first direction, a plurality of the upper electrode intersecting the plurality of lower electrodes in a second direction, and where the first semiconductor oxide layer and the second semiconductor oxide layer may be between the plurality of lower electrodes and the plurality of upper electrodes at intersections of the plurality of lower electrodes and the plurality of upper electrodes.

According to an example embodiment, a nonvolatile memory array may include a plurality of nonvolatile memory devices, a plurality of lower common electrodes in a first direction, a plurality of upper common electrodes intersecting the plurality of lower common electrodes in a second direction, where a nonvolatile memory device of the plurality of nonvolatile memory devices may be between the plurality of lower common electrodes and the plurality of upper common electrodes at intersections of the plurality of lower common electrodes and the plurality of upper common electrodes.

According to an example embodiment, the first type semiconductor oxide layer and the second type semiconductor oxide layer may be sequentially formed between the first and second electrodes.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Example embodiments of a nonvolatile memory device having self-presence diode characteristics, and a nonvolatile memory array including the nonvolatile memory device will be described more fully hereinafter with reference to the accompanying drawings. In the drawings, the thickness and width of each layer or region may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 2A:
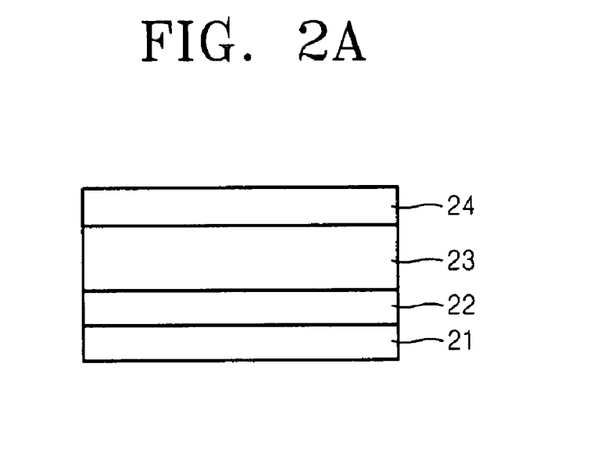
FIG. 2A is a cross-sectional view illustrating a nonvolatile memory device having self-presence diode characteristics according to an example embodiment.

FIG. 2A is a cross-sectional view of a nonvolatile memory device according to an example embodiment. Referring to FIG. 2A, the nonvolatile memory device may have a structure in which a lower electrode 21, a first oxide layer 22, a second oxide layer 23, and/or an upper electrode 24 may be formed. For example, the nonvolatile memory device may have a structure in which a lower electrode 21, a first oxide layer 22, a second oxide layer 23, and/or an upper electrode 24 may be sequentially formed. The lower electrode 21 or the upper electrode 24 may be formed of metal or a metal oxide having an electric conductance, for example, Ir, Ru, Pt, or an oxide comprising Ir, Ru, and Pt. The first oxide layer 22 may be formed of an n-type or a p-type semiconductor material. The second oxide layer 23 may be formed of a material having varying resistance properties, for example, a transition metal oxide.

Figure 3A:
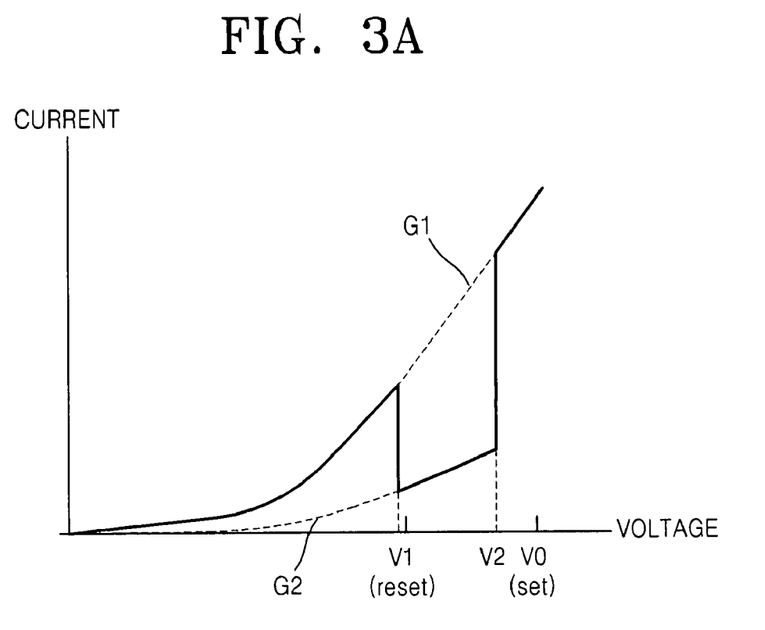
FIG. 3A is an example I-V graph illustrating the I-V electrical characteristics of a resistance memory device, according to an example embodiment.

The features of the transition metal oxide having variable resistance properties, and constituting the second oxide layer 23 will be described with reference to FIGS. 3A and 3B. FIG. 3A is an example graph illustrating the I-V electrical characteristics of a resistance memory device having an oxide layer formed of a transition metal oxide with general variable resistance characteristics, according to an example embodiment.

The example graph of FIG. 3A illustrates two current-voltage (I-V) curves G1 and G2 of the transition metal oxide having variable resistance characteristics. For example, the curve G1 may show a case where an oxide layer may have a lower resistance value, for example, a current flowing through the oxide layer may be lower with respect to the same voltage. The curve G2 may show a case where the resistance value of the oxide layer may be increased, for example, the current flowing through the oxide layer may become higher with respect to the same voltage. When the current is measured while gradually increasing a supply voltage from 0V to V1, the current may increase in proportion to a voltage along with curve G1. However, when a voltage V1 is applied to the oxide layer, the current may be reduced to correspond with curve G2. When a voltage V2 is applied to the oxide layer, the current may increase to correspond with curve G1. It may be assumed that a resistance state according to the characteristics of the curve G1 may be a first resistance state, and a resistance state according to the curve G2 may be a second resistance state. For example, the resistance value of the oxide layer may rapidly increase when V1≦V≦V2.

The memory characteristics of the transition metal oxide of example embodiments will now be described. When a voltage V, which may be less than V2 and greater than V1, and a voltage lower than V1 are sequentially applied to the transition metal oxide, a current corresponding to the curve G2 may be detected. When a voltage V greater than V2 and a voltage lower than V1 are sequentially applied, a current corresponding to the G1 curve may be detected. Accordingly, the transition metal oxide may be used as a memory device, based on the above-described I-V characteristics of the transition metal oxide.

Figure 3B:
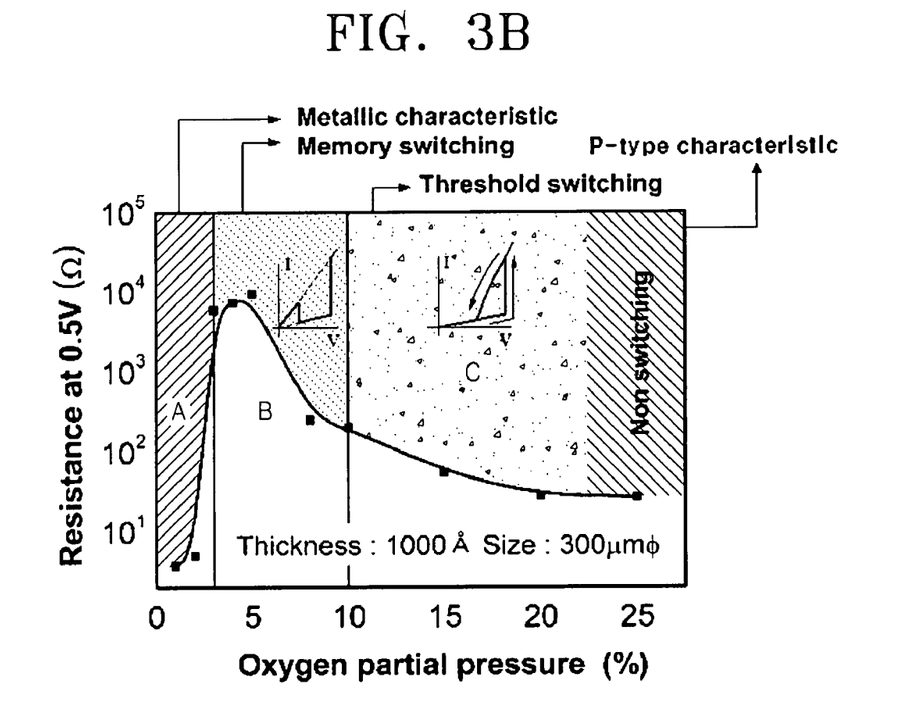
FIG. 3B is an example graph illustrating resistance versus oxygen partial pressure during a deposition of a transition metal oxide, according to an example embodiment.

FIG. 3B is an example graph illustrating resistance versus oxygen partial pressure characteristics of a transition metal oxide during a manufacturing process of Ni oxide, which may be a transition metal oxide, according to an example embodiment. Referring to FIG. 3B, Ni oxide may show characteristics similar to those of general Ni in an A region where the oxygen partial pressure may be lower. The higher the oxygen partial pressure, the greater the resistance value of the transition metal oxide. In a B region where oxygen partial pressure is in a range from 3% to 10%, the transition metal oxide may be used as a memory device having switching characteristics. However, when oxygen partial pressure exceeds 5%, the resistance value of the transition metal oxide may reduce. In a C region where oxygen partial pressure may be equal to or greater than 10%, the resistance value may gradually reduce. Ni oxide formed in the C region may have threshold switching characteristics, and may change gradually into a p-type material.

When the second oxide layer 23, according to example embodiments, is formed of Ni oxide, the Ni oxide may preferably be formed in order to have the memory switching characteristics of region B as illustrated in FIG. 3B. Because Ni oxide in the B region may not be a p-type oxide, Ni oxide need not exhibit diode characteristics. However, when Ni oxide is formed on the first oxide layer 22 of an n-type oxide and the resultant structure is thermally processed at a temperature of several hundreds of degrees Celsius, a p-n junction structure may be formed at an interface between the first and second oxide layers 22 and 23.

Accordingly, the p-n junction structure at the interface between the first and second oxide layers 22 and 23 may act as a diode. The second oxide layer 23 may have the memory switching characteristics as illustrated in FIG. 3A and may act as a memory node. For example, examples of transition metal oxide having variable resistance characteristics may include Ni oxide, $TiO_2$, HfO, ZrO, ZnO, $WO_3$, CoO, and/or $Nb_2O_5$. In example embodiments, most of the transition metal oxides having memory switching characteristics may be used as an n-type oxide by controlling oxygen partial pressure, and Ni oxide may be used as a p-type oxide in the C region as illustrated in FIG. 3B. Accordingly, when the second oxide layer 23 is formed of $TiO_2$, ZnO, or CoO having the memory switching characteristics, the first oxide layer 22 may be formed of a p-type material, for example Ni oxide. In example embodiments, the thickness of each layer that may constitute a nonvolatile memory device having self-presence diode characteristics may not be limited thereto. For example, each layer may be formed to a thickness from several nanometers to several hundreds of nanometers. The lower electrode 21 and/or the first oxide layer 22, the upper electrode 24, and/or the second oxide layer 23 may be preferably Schottky diode coupled.

Figure 2B:
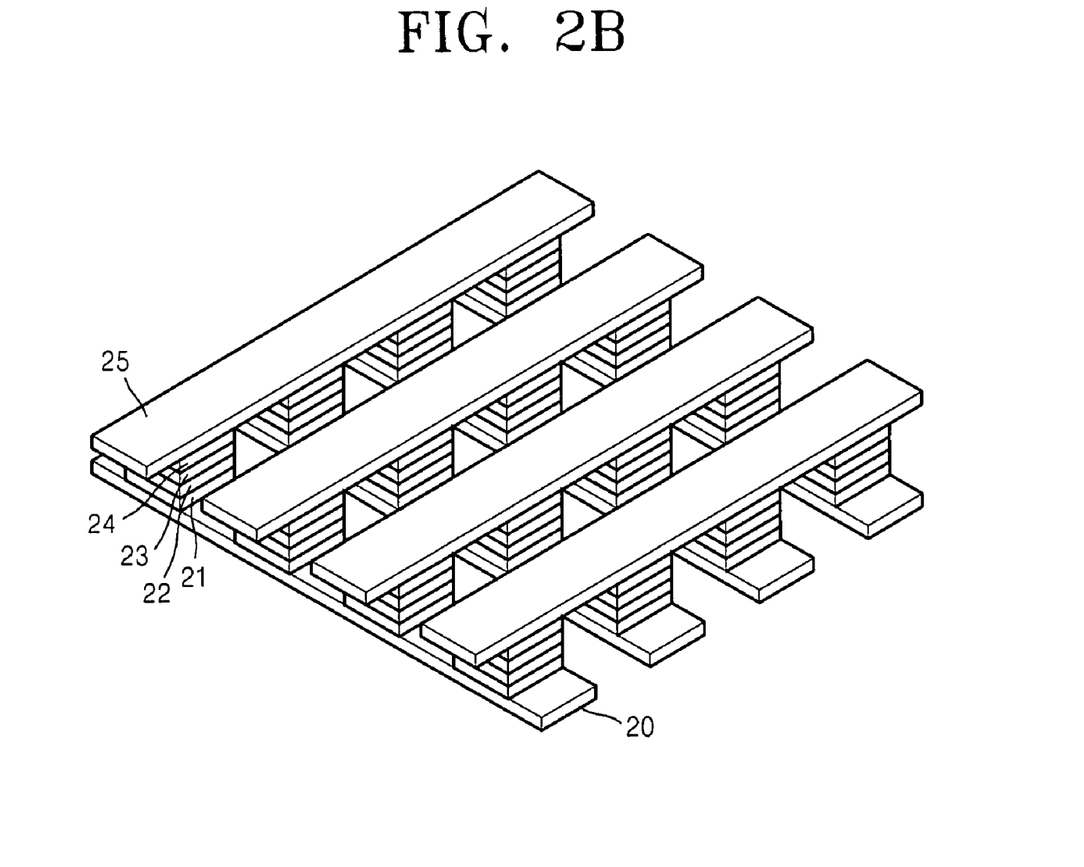
FIG. 2B is a perspective view illustrating a nonvolatile memory device having a cross-point type memory array structure, according to an example embodiment.

FIG. 2B is a perspective view illustrating a nonvolatile memory device having a cross-point type memory array structure, according to an example embodiment. In example embodiments, each unit cell may include the nonvolatile memory device illustrated in FIG. 2A, and reference numerals 20 and 25 may denote common electrodes coupled to the lower electrode 21 and/or the upper electrode 24, respectively. The lower electrode 21 and/or the upper electrode 24 may be fabricated as common electrodes. In example embodiments, the lower electrode 21 may be formed in a first direction, the upper electrode 24 may intersect the lower electrode 21, and the first and second oxide layers 22 and 23 may be formed between the lower and upper electrodes 21 and 24.

The I-V electrical characteristics of a related memory device, and a nonvolatile memory device having self-presence diode characteristics according to example embodiments, are illustrated in FIGS. 4A through 4C and FIG. 5.

Figure 4A:
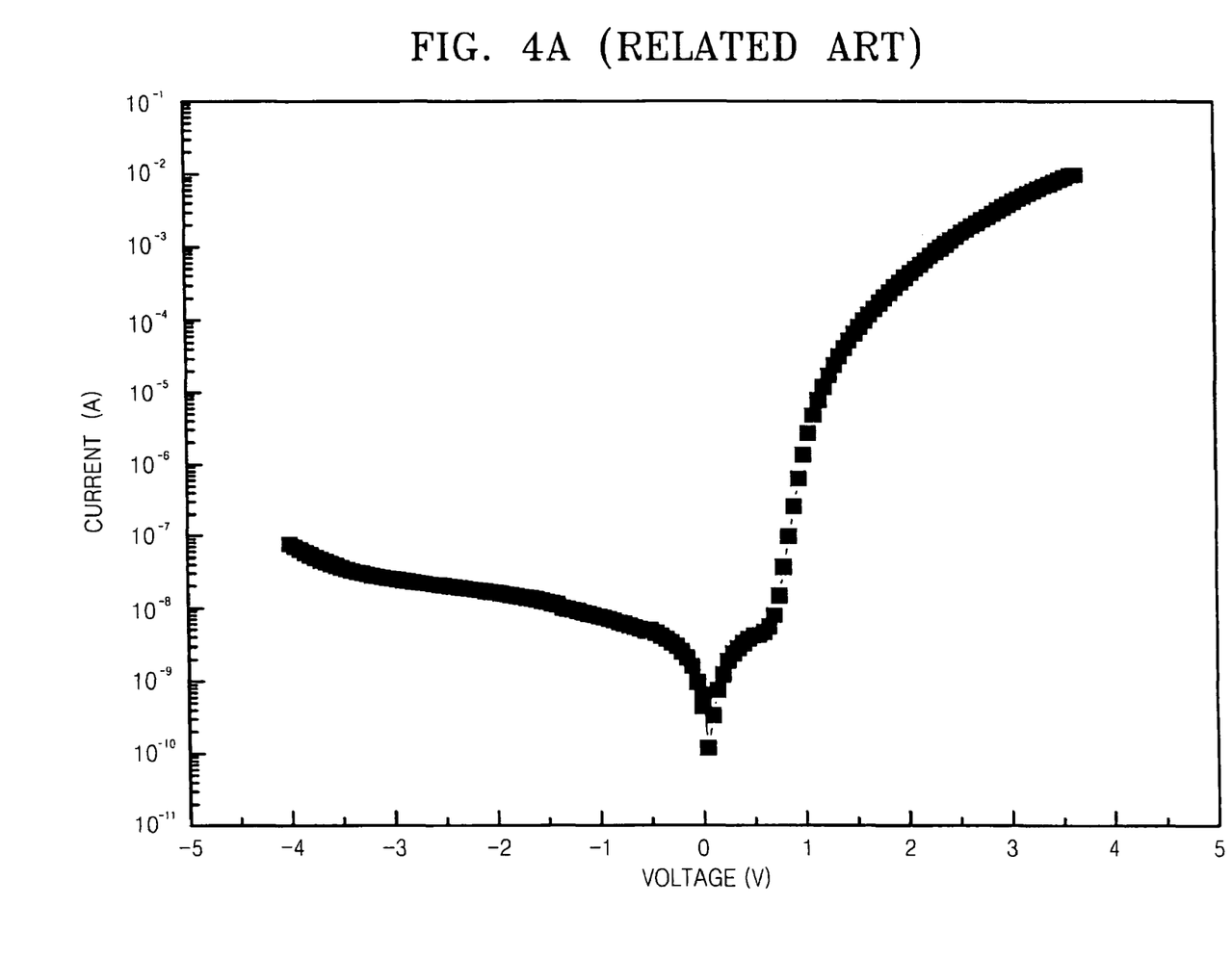
FIG. 4A is an example graph illustrating the I-V electrical characteristics of a diode in the related resistance memory device of FIG. 1A.
Figure 4B:
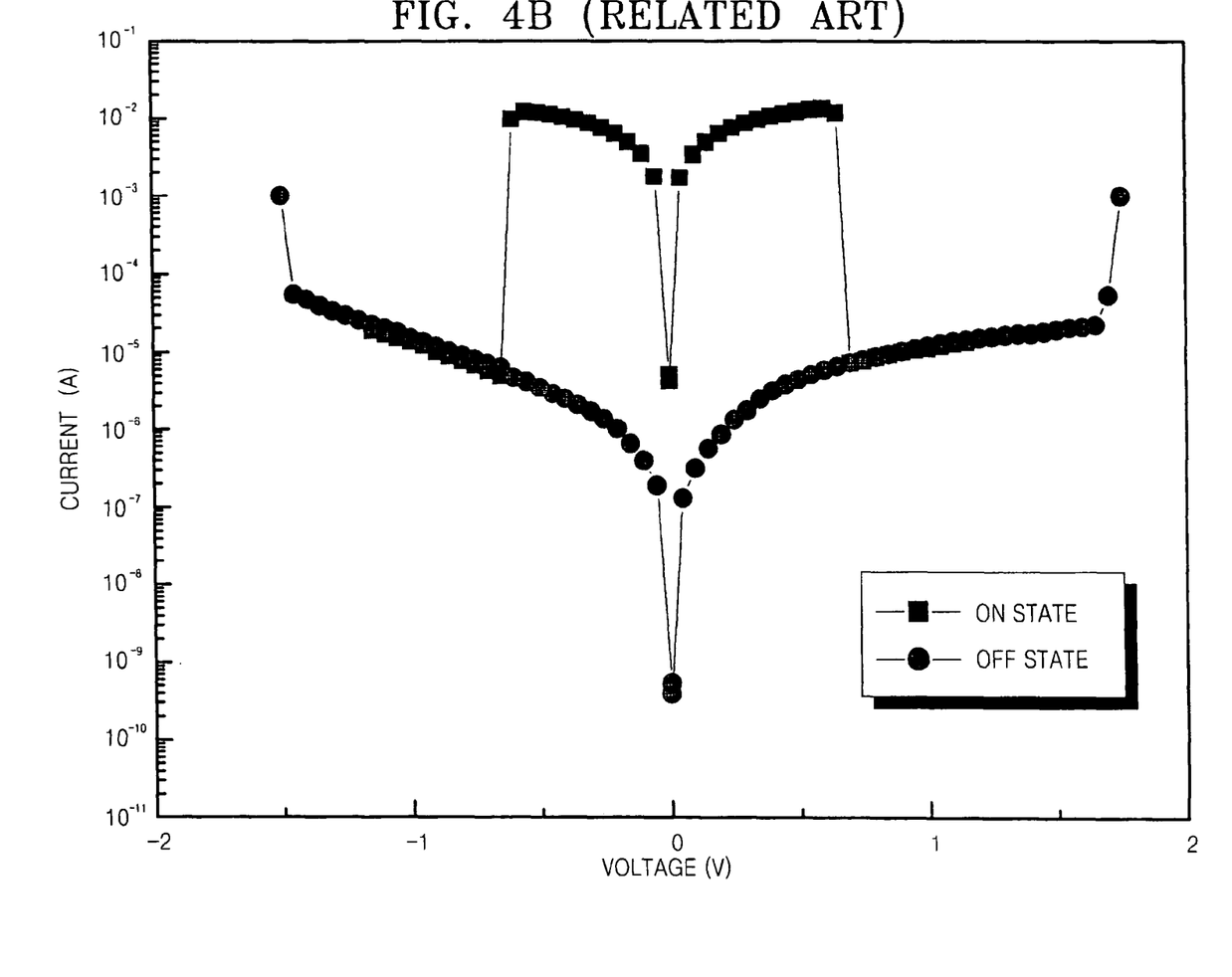
FIG. 4B is an example graph illustrating the switching characteristics of the related resistance memory device of FIG. 1A.
Figure 4C:
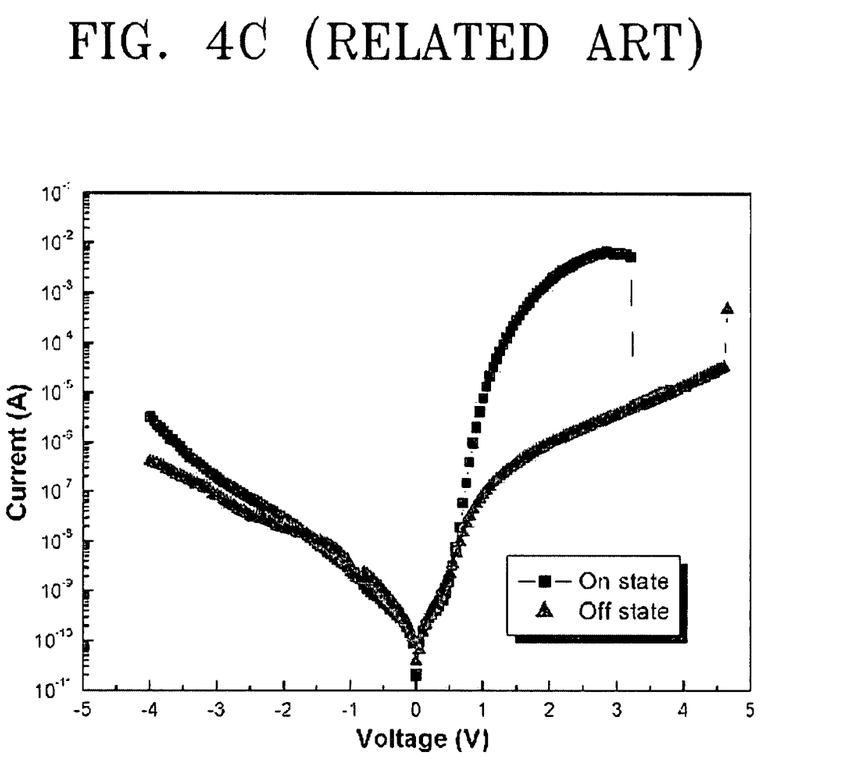
FIG. 4C is an example graph illustrating the I-V electrical characteristics of the related resistance memory device of FIG. 1A.

FIGS. 4A through 4C are example graphs illustrating the I-V electrical characteristics of the related memory device illustrated in FIG. 1A. FIG. 4A illustrates the I-V electrical characteristics of a diode structure. An example embodiment may be fabricated by forming an n-type semiconductor layer by depositing $TiO_2$ on the lower electrode 21 to a thickness of about 20 nm, and/or forming a p-type semiconductor layer by depositing Ni oxide on the resultant structure to a thickness of about 10 nm. For example, Ni oxide may have the characteristics of the C region illustrated in FIG. 3B. Referring to FIG. 4A, an example graph showing diode characteristics is obtained. FIG. 4B is an example graph illustrating the I-V curve of Ni oxide in the B region of FIG. 3B, which shows memory switching characteristics. FIG. 4C is an example graph illustrating the I-V characteristics of the resultant structure obtained by forming a memory switching device on the related diode structure illustrated in FIG. 1A. For example, an object sample may be obtained by sequentially depositing a p-type semiconductor layer formed of Ni oxide, an intermediate electrode layer, and/or a Ni oxide layer on an n-type semiconductor layer formed of $TiO_2$. For example, an example graph showing memory switching characteristics may be obtained in a region of a voltage equal to or greater than 0 V but may not obtained be for a region of a voltage less than or equal to 0 V.

Figure 5:
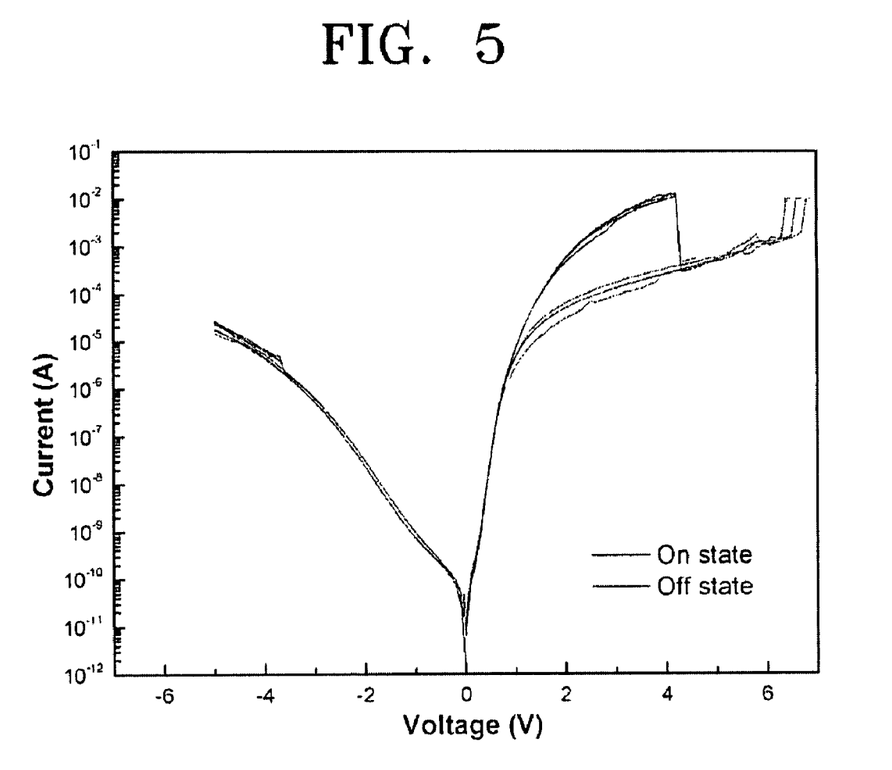
FIG. 5 is an example graph illustrating the I-V electrical characteristics of a nonvolatile memory device with self-presence diode characteristics according to an example embodiment.

FIG. 5 is an example graph illustrating the I-V electrical characteristics of a nonvolatile memory device having self-presence diode characteristics, according to an example embodiment. In example embodiments, a sample used may be fabricated by forming a first oxide layer 22 of $TiO_2$ and/or a second oxide layer 23 of Ni oxide in the B region of FIG. 3B.

Referring to FIG. 5, the switching characteristics of a memory device containing a resistance conversion material may occur in the region where the voltage may be equal to or greater than 0V, but need not occur in the other regions. For example, the example graph of FIG. 5 is similar to that of FIG. 4C illustrating the I-V characteristics of the sample fabricated by separately forming a diode and forming a memory structure on the diode. Accordingly, it may be possible to form a Ni oxide switching structure having diode characteristics by inducing a p-n junction structure to be formed at an interface between $TiO_2$, which may be the first oxide layer 22, and Ni oxide, which may be the second oxide layer 23, through an annealing process. Accordingly, it may be possible to form a region acting as a diode in a memory device without forming an additional diode.

A memory device having self-presence diode characteristics according to an example embodiment may be manufactured through a well-known semiconductor manufacturing process, for example a conventional DRAM manufacturing process. Accordingly, it may be simpler to manufacture a memory device having self-presence diode characteristics, according to an example embodiment, thereby increasing the yield while reducing the manufacturing costs.

Example embodiments may have the following advantages. Unit cells of a nonvolatile memory device of example embodiments may have a simpler structure because they do not need an additional switching device, for example a transistor or a diode. If the nonvolatile memory device of example embodiments is formed in the form of a three-dimensional (3D) stack, the nonvolatile memory device of example embodiments may efficiently accomplish the required operations. For example, a memory node of example embodiments may act as a switching device, thereby simplifying the cell structure.

A memory device of example embodiments may be simpler to manufacture by using conventional semiconductor manufacturing processes, thereby increasing the yield while reducing the manufacturing costs.

It may be possible to make a higher-density memory array by forming a simply structured memory device having diode characteristics in the form of an array structure of example embodiments.

Although example embodiments have been shown and described in this specification and figures, it would be appreciated by those skilled in the art that changes may be made to the illustrated and/or described example embodiments without departing from their principles and spirit, the scope of which is defined by the claims and their equivalents.

What is claimed is:

1. A nonvolatile memory device comprising:
a plurality of lower electrodes;
a first semiconductor oxide layer of a transition metal oxide on the plurality of lower electrodes;
a second semiconductor oxide layer of a transition metal oxide on the first semiconductor oxide layer;
a plurality of upper electrodes on the second semiconductor oxide layer;
a plurality of lower common electrodes in a first direction on the plurality of lower electrodes; and
a plurality of upper common electrodes on the plurality of upper electrodes, the plurality of upper common electrodes intersecting the plurality of lower common electrodes in a second direction,
wherein the second semiconductor oxide layer has memory switching characteristics,
the first semiconductor oxide layer and the second semiconductor oxide layer are between the plurality of lower electrodes and the plurality of upper electrodes at intersections of the plurality of lower common electrodes and the plurality of upper common electrodes, and
a p-n junction is at an interface between the first and second semiconductor oxide layers, the p-n junction p-n diode coupling the first semiconductor oxide layer and the second semiconductor oxide layer.

2. The nonvolatile memory device of claim 1, wherein the first semiconductor oxide layer is one of a p-type semiconductor and a n-type semiconductor and the second semiconductor oxide layer is one of a p-type semiconductor and a n-type semiconductor.

3. The nonvolatile memory device of claim 2, wherein at least one of the first and second semiconductor oxide layers is n-type, and
the n-type semiconductor oxide layer includes one of $TiO_2$, HfO, ZrO, ZnO, $WO_3$, CoO, and $Nb_2O_5$.

4. The nonvolatile memory device of claim 2, wherein at least one of the first and second semiconductor oxide layers is p-type, and the p-type semiconductor oxide layer includes Ni oxide.

5. The nonvolatile memory device of claim 1, wherein the plurality of lower electrodes and the first semiconductor oxide layer, or the plurality of upper electrodes and the second semiconductor oxide layer are schottky diode coupled.

6. The nonvolatile memory device of claim 1, wherein the first semiconductor oxide layer and the second semiconductor oxide layer are sequentially stacked between the plurality of lower electrodes and the plurality of upper electrodes at the intersections of the plurality of common lower electrodes and the plurality of common upper electrodes.

7. A nonvolatile memory array comprising:

a plurality of nonvolatile memory devices, each of the plurality of nonvolatile memory devices including a lower electrode, a first semiconductor oxide layer of a transition metal oxide on the lower electrode, a second semiconductor oxide layer of a transition metal oxide with memory switching characteristics on the first semiconductor oxide layer, a p-n junction at an interface between the first and second semiconductor oxide layers, the p-n junction p-n diode coupling the first semiconductor oxide layer and the second semiconductor oxide layer, and an upper electrode on the second semiconductor oxide layer;

a plurality of lower common electrodes in a first direction; and a plurality of upper common electrodes intersecting the plurality of lower common electrodes in a second direction, wherein each nonvolatile memory device of the plurality of nonvolatile memory devices is between the plurality of lower common electrodes and the plurality of upper common electrodes at intersections of the plurality of lower common electrodes and the plurality of upper common electrodes.

8. The nonvolatile memory array of claim 7, wherein the first semiconductor oxide layer is one of a p-type semiconductor and a n-type semiconductor and the second semiconductor oxide layer is one of a p-type semiconductor and a n-type semiconductor.

9. The nonvolatile memory array of claim 7, wherein the lower electrode and the first semiconductor oxide layer, or the upper electrode and the second semiconductor layer are Schottky diode coupled.

* * * * *